(12) United States Patent
Hurkx et al.

(10) Patent No.: US 7,791,108 B2
(45) Date of Patent: Sep. 7, 2010

(54) NANOWIRE TUNNELING TRANSISTOR

(75) Inventors: Fred Hurkx, Best (NL); Prabhat Agarwal, Brussels (BE)

(73) Assignee: NXP B.V., Eindhoven (NL)

( * ) Notice: Subject to any disclaimer, the term of this patent is extended or adjusted under 35 U.S.C. 154(b) by 290 days.

(21) Appl. No.: 12/161,574

(22) PCT Filed: Jan. 24, 2007

(86) PCT No.: PCT/IB2007/050241

§ 371 (c)(1),
(2), (4) Date: Jul. 21, 2008

(87) PCT Pub. No.: WO2007/086009

PCT Pub. Date: Aug. 2, 2007

(65) Prior Publication Data

US 2009/0008631 A1    Jan. 8, 2009

(30) Foreign Application Priority Data

Jan. 25, 2006   (EP) .................................. 06100816
Jan. 24, 2007   (WO) ................. PCT/IB2007/050241

(51) Int. Cl.
H01L 21/336    (2006.01)
H01L 21/8235   (2006.01)
(52) U.S. Cl. ........................ 257/198; 257/285; 977/750; 977/813; 977/938
(58) Field of Classification Search .................. 257/198, 257/285, E21.404, E29.168; 977/750, 813, 977/938
See application file for complete search history.

(56) References Cited

U.S. PATENT DOCUMENTS 7,180,107 B2 *    2/2007   Appenzeller et al. ......... 257/288
2009/0224230 A1 *    9/2009   Pesetski et al. ............... 257/24

FOREIGN PATENT DOCUMENTS

WO    2004124872 A1    1/2004
WO    2005124872 A     12/2005

OTHER PUBLICATIONS

Kimura M et al; "A New Type of Schottky Tunnel Transistor", IEEE Electron Device Letters, vol. 15, No. 10, IEEE, IEEE Electron Devices Society, Piscataway, NJ. Oct. 1994, p. 412.

Hattori R et al; "A New Type of Tunnel-Effect Transistor Employing Internal Field Emission of Schottky Barrier Junction", Japanese Journal of Applied Physics, Tokyo, Japan. vol. 31, Part 2, No. 10B, Oct. 15, 1992, pp. L1467-L1469.

(Continued)

Primary Examiner—William M. Brewster

(57) ABSTRACT

A transistor comprises a nanowire (22, 22') having a source (24) and a drain (29) separated by an intrinsic or lowly doped region (26, 28). A potential barrier is formed at the interface of the intrinsic or lowly doped region (26, 28) and one of the source (24) and the drain (29). A gate electrode (32) is provided in the vicinity of the potential barrier such that the height of the potential barrier can be modulated by applying an appropriate voltage to the gate electrode (32).

11 Claims, 9 Drawing Sheets

OTHER PUBLICATIONS

Figure 1:
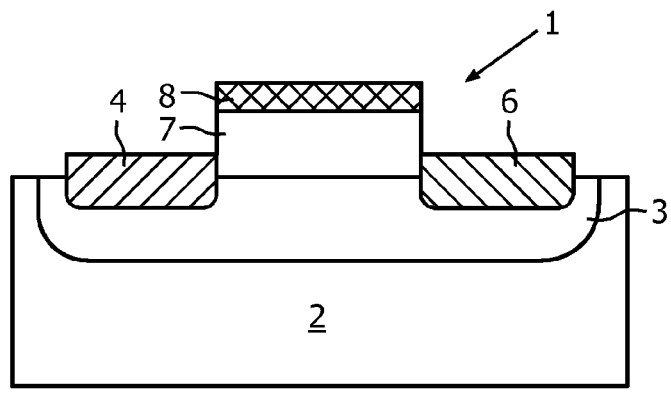

Sang-Mo Koo et al; "Silicon Nanowires as Enhancement-Mode Schottky Barrier Field-Effect Transistors", Nanotechnology, IOP, Bristol, GB, vol. 16, No. 9, Sep. 1, 2005, pp. 1482-1485.

Rao V R et al; "Low Temperature-High Pressure Grown Thin Gate Dielectrics for MOS Applications", Microelectronic Engineering, Elsevier Publishers BV, Amsterdamn, NL, vol. 48, No. 1-4, Sep. 1999, pp. 223-226.

Ramgopal Rao V et al; "Simulation, Fabrication and Characterization of High Performance Planar-Doped-Barrier Sub 100 NM Channel Mosfets", Electron Devices Meeting, 1997. Technical Digest., International Washington, D.C., USA. Dec. 7-10, 1997, New York, NY, USA, IEEE, US, Dec. 7, 1997, pp. 811-814.

Zhao Q et al; "Nanopatterning of Epitaxial COSI2 Using Oxidation in a Local Stress Field and Fabrication of Nanometer Metal-Oxide-Semiconductor Field-Effect Transistors", Journal of Applied Physics, American Institute of Physics, New York, US, vol. 96, No. 10, Nov. 15, 2004, pp. 5775-5780.

Lee C; "Single-Electron Tunnelling Transistor in SIGE/SI Double-Barrier Structures", Semiconductor Science and Technology, IOP, Bristol, GB. vol. 13, No. 8A, Aug. 1998, pp. A115-A118.

* cited by examiner

NANOWIRE TUNNELING TRANSISTOR

The present invention is related to a nanowire tunneling transistor and in particular to a nanowire tunneling transistor according to claim 1.

As the channel lengths of metal oxides semiconductor field effect transistors (MOSFET) scale into the nanometer regime, short channel effects become more and more significant. Consequently effective gate control is required for a nanoscale MOSFET to achieve good device performance. For this reason, silicon nanowires which allow multigate, "gate-all-around" or "wrap-around" gate transistors are explored.

Vertical epitaxial semiconducting nanowire devices have been explored as possible future transistor device candidates. Of the many devices that have been examined, the "wrap-around" gate device is the most widely studied. The latter device is provided with an annular gate electrode around a nanowire to control the electronic properties inside the nanowire.

By the vapor-liquid-solid (VLS) technique it is possible to grow monocrystalline nanowires of a wide variety of semiconducting materials (SiGe, Zno, GaAs, InAs etc.).

The VLS technique also allows for growing longitudinal heterostructure nanowires (LOHN). A LOHN structure comprises at least one segment of a substantially crystalline material adjacent to at least another segment of a compositionally different material where a junction is formed there between. A LOHN structure is not limited to only two adjacent segments but can include a plurality of compositionally different materials. By the term "compositionally different" the following possibilities are encompassed:

a) Materials that have different chemical composition whether intrinsic or doped, and
b) Materials that have different crystal directions e.g. identical materials but with different crystal orientation.

The nanowire heterostructure could comprise compositionally different materials when viewed longitudinally such as would be the case with alternating or periodic segments of different materials or multi segmented nanowires where at least two of the segments comprise different materials.

However, devices with dimensions on the nanometer scale have a number of distinct disadvantages. Specifically:
1. Fluctuations in impurity doping in the active regions are expected to be large and unavoidable.
2. The transconduction of the device depends on the gate length. In nanowire field effect transistor devices very small gate lengths can be made only with significant technical difficulty.

A lateral MOSFET device concept that depends less on doping concentration and on channel length has been proposed in 1992 and has been described by R. Hattori, A. Nakae and J. Shirafuji in Jpn. J. Appl. Phys., vol. 31, p. L1467, 1992. This device used metal source and drain regions. The Schottky barriers between these regions can be modulated by a gate voltage applied to a gate electrode.

In spite of all the progress that has been made, there still remains a need for improved transistors.

The invention suggests a transistor comprising a nanowire having a source and a drain separated by an intrinsic or lowly doped region. A potential barrier is formed at the interface of the intrinsic or lowly doped region and one of the source and the drain. A gate electrode is provided in the vicinity of the potential barrier such that the effective height and/or width of the potential barrier can be modulated by applying an appropriate voltage to the gate electrode.

In an advantageous embodiment of the inventive transistor a barrier region is located inside the intrinsic or lowly doped region between the source and the drain.

According to the invention the barrier region can be a highly doped semiconductor material. The material of the barrier region must be chosen such that it forms a narrow barrier to the adjacent lowly doped or intrinsic semiconductor regions. Examples of such a material are various metals and highly doped semiconductor regions with an appropriate electron affinity to ensure proper operation of the transistor.

In a practical embodiment of the inventive transistor the semiconductor material forming the barrier region is indium arsenide while the adjacent intrinsic or lowly doped regions are made of silicon or gallium arsenide.

In another embodiment the barrier is made from a metal. In this case the potential barriers at the interfaces of the barrier region are usually referred to as Schottky barriers.

Preferably the nanowire can be grown on a semiconductor substrate.

In an advantageous improvement of the invention the nanowire has highly doped end portions forming source and drain of the transistor.

In one practical embodiment of the inventive transistor the outer surface of the nanowire is covered by an insulating layer. In this case it is preferable that on top of the insulating layer a metal layer is deposited forming a gate electrode. In specific embodiments the insulating layer is a dielectric layer or a wide band gap semiconductor forming a Schottky barrier to the gate electrode. In one of the specific embodiments the wide band gap semiconductor forming the Schottky barrier to the gate electrode contains a delta-doped layer.

Figure 2A:
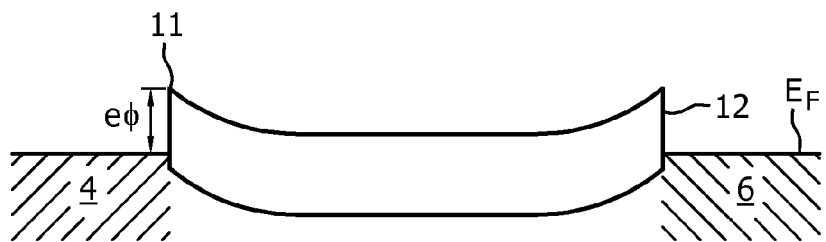
Figure 2B:
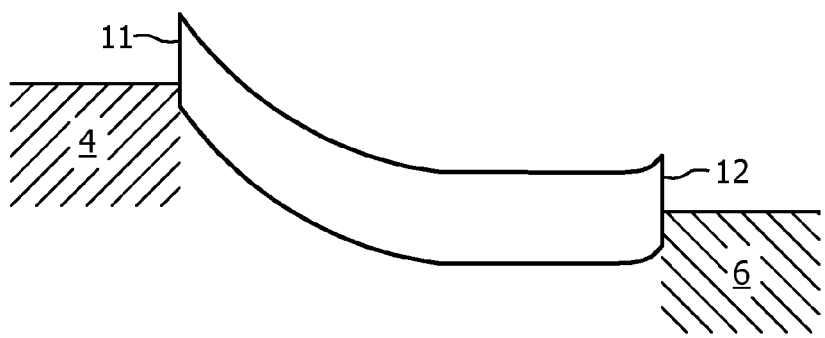
Figure 2C:
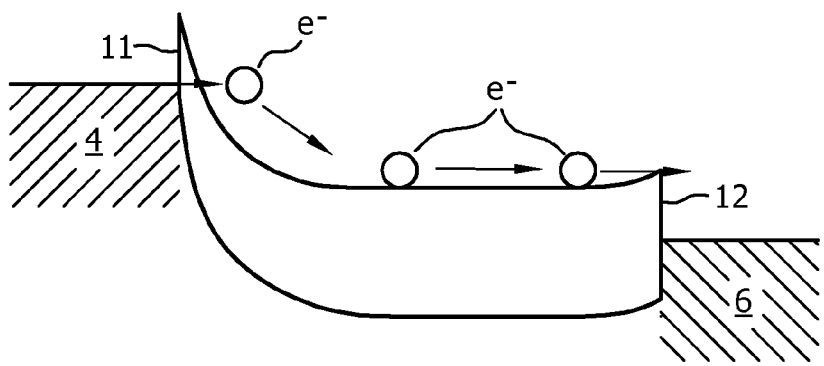
Figure 3:
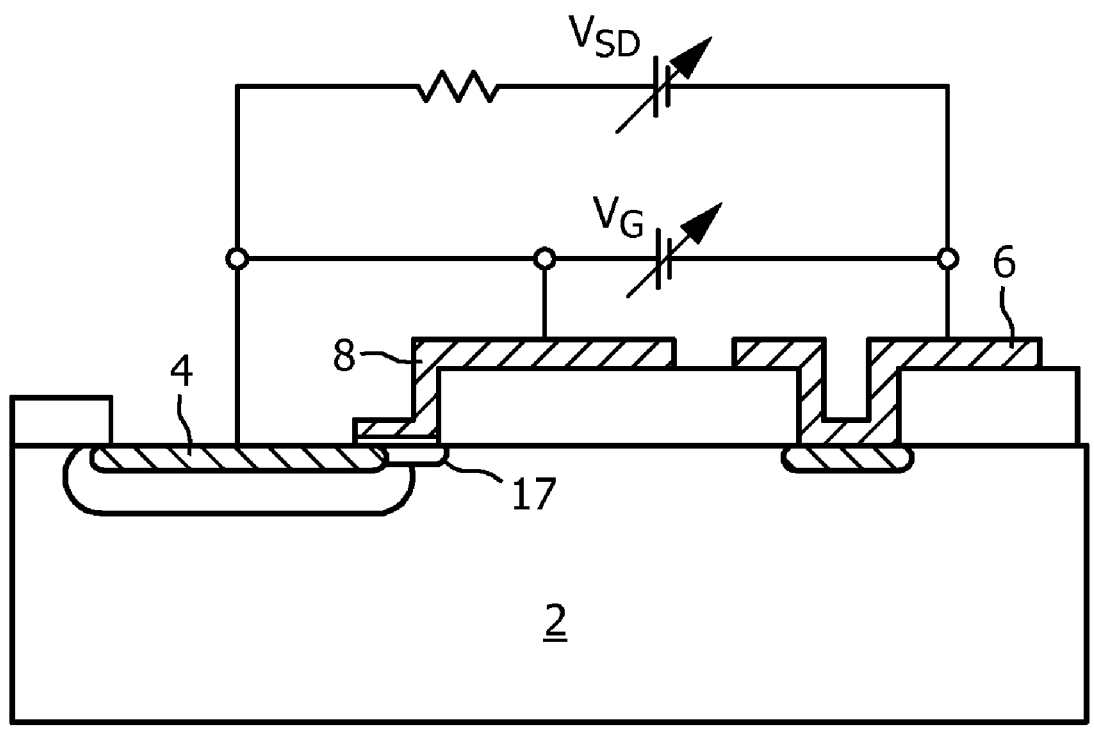
Figure 4:
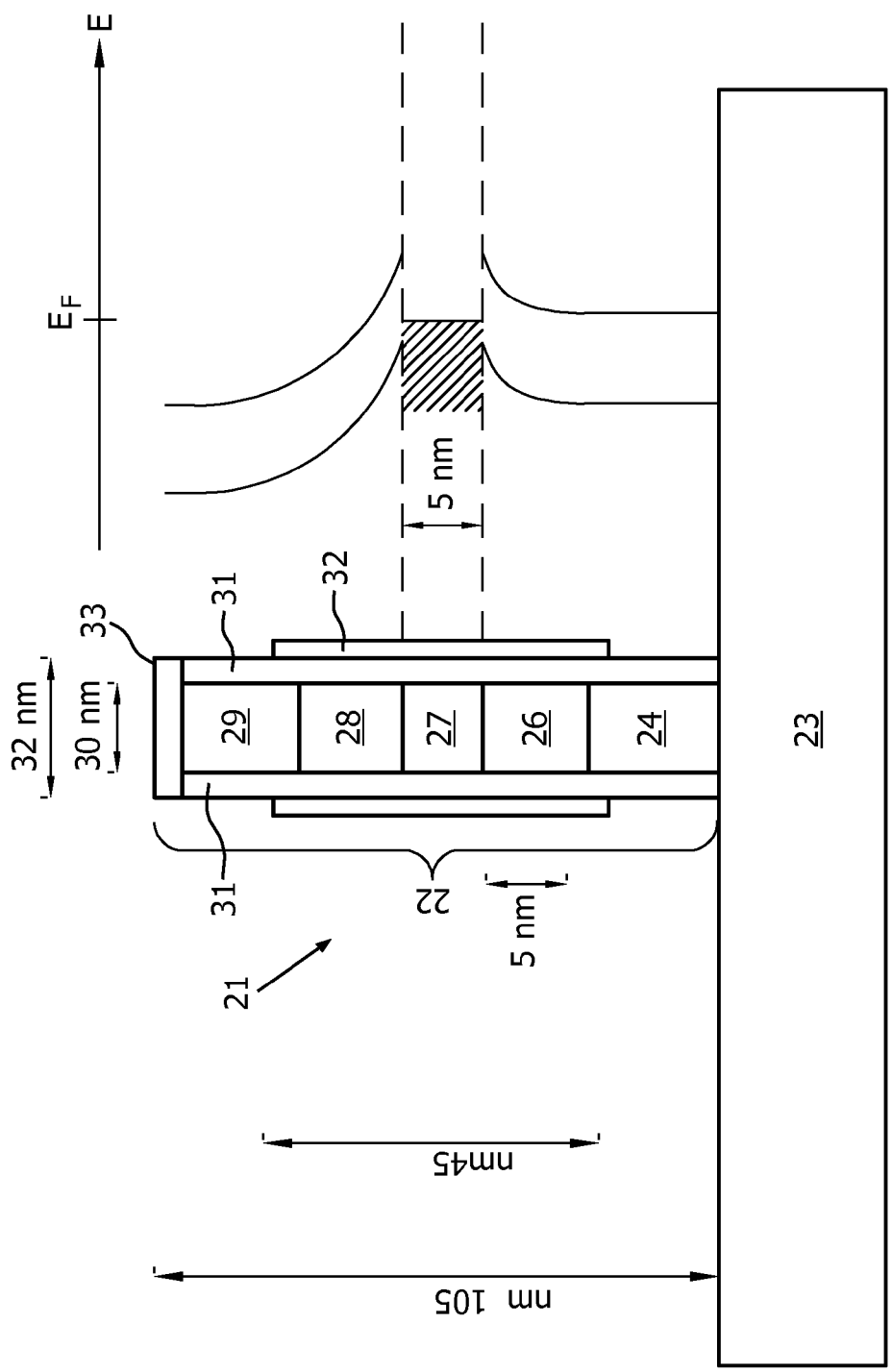
Figure 6:
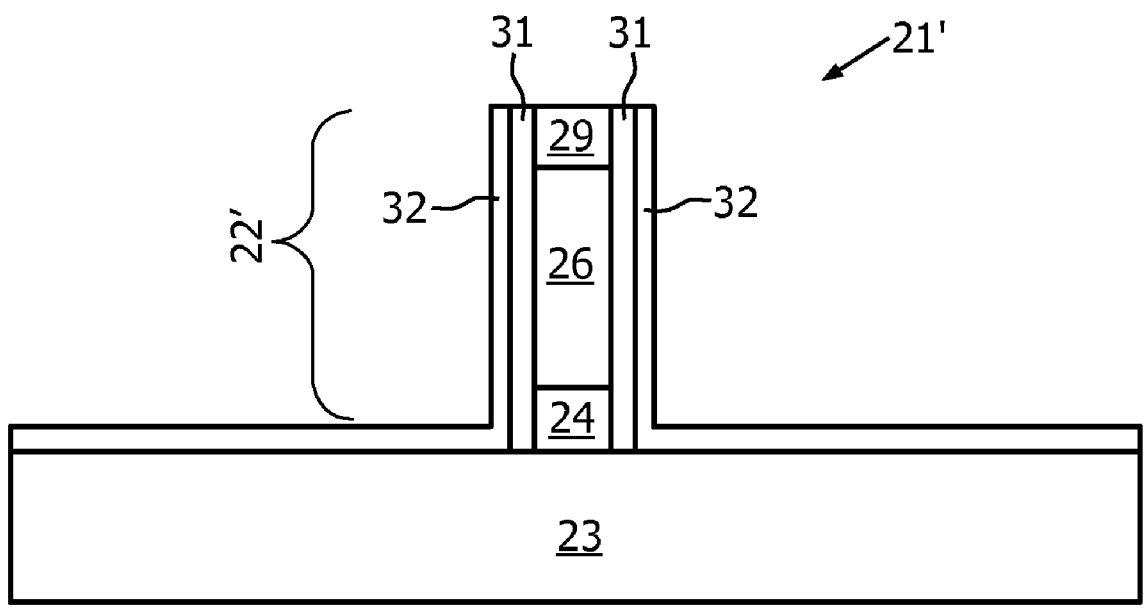
Figure 7A:
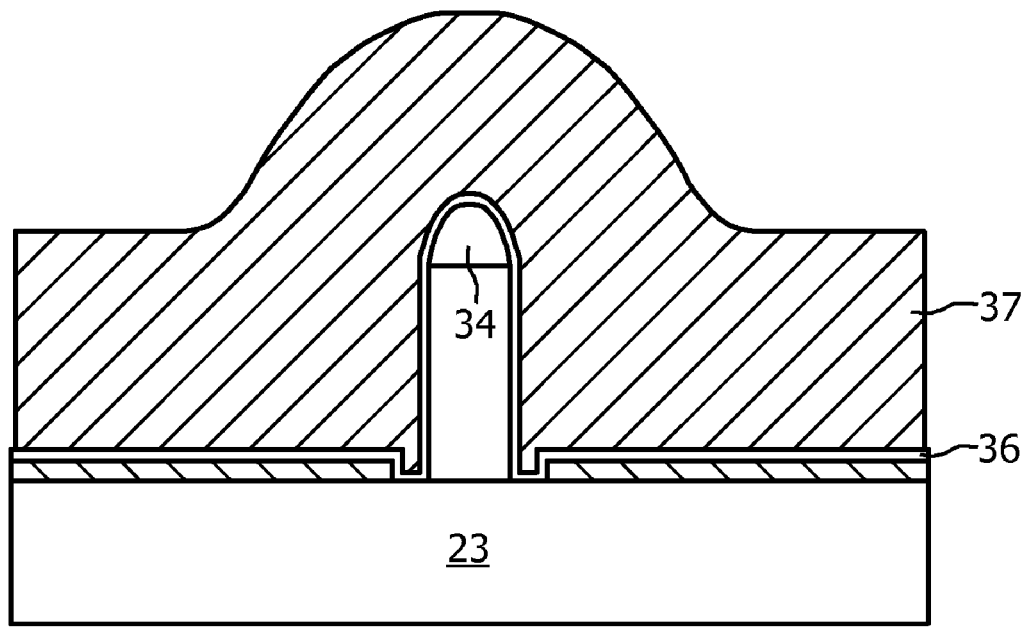
Figure 7B:
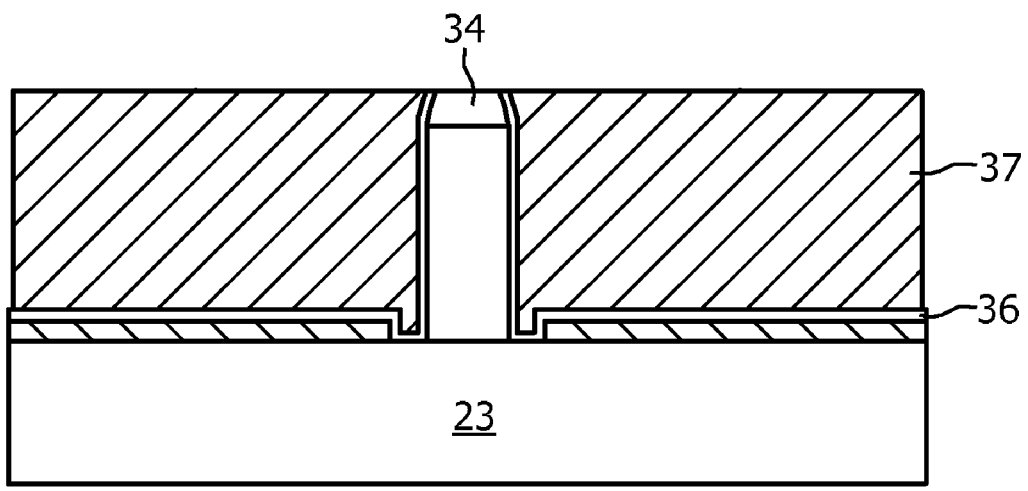

The invention will be better understood and other particular features and advantages will become apparent on reading the following description appended with drawings. Similar or corresponding elements are designated with the same reference numbers. It shows:

FIG. 1 a schematic structure of a lateral Schottky source-drain MOSFET transistor which is known in the prior art;

FIGS. 2a to 2c show the electronic band structure of the transistor shown in FIG. 1 with different bias voltages applied;

FIG. 3 a schematic of a known Schottky tunnel transistor;

FIG. 4 a schematic structure of a nanowire transistor according to a first embodiment of the present invention and its band structure;

FIGS. 5a to 5h a sequence of processing steps to fabricate the nanowire transistor structure of FIG. 4;

FIG. 6 a schematic structure of a nanowire transistor according to a second embodiment of the present invention; and FIGS. 7a and 7b a sequence of processing steps to fabricate the nanowire transistor structure of FIG. 6.

FIG. 1 shows a tunnel effect transistor as has been described by R. Hattori, A. Nakae and J. Shirafuji in Japanese Journal of Applied Physics, Volume 31 (1992), L1467 to L1469. The known transistor is a lateral transistor structure, which employs internal field emission of a Schottky barrier junction. The transistor, which is designated as a whole with reference number 1 is fabricated on a conventional p-type silicon substrate 2. A highly n-type doped channel layer 3 is realized on the topside of the substrate by conventional implantation of phosphorus or arsenic ions. The channel layer 3 is laterally defined by a masking step. By further masking steps a source 4 and a drain 6 are deposited by growing palladium silicide (PdSi) on top of the channel layer 3. The source 4 and the drain 6 are separated by an insulator layer 7 made of silicon oxide ($SiO_2$) on top of which a metallic gate 8 is deposited.

FIG. 2a shows the band structure illustrated in FIG. 1 with no bias voltage applied between source 4 and drain 6 and with zero gate voltage. As usual the Fermi level $E_F$ is a straight line across the whole band diagram of the transistor structure. Between the source 4 and the channel layer 3 there is an interface 11. Between the drain 6 and the channel layer 3 there is an interface 12. At the interfaces 11, 12 Schottky barriers are formed. The height of the Schottky barriers is indicated in FIG. 2a as eΦ. FIG. 2b shows the same band structure with a bias voltage applied between source 4 and drain 6 but with still no gate voltage applied. The Schottky barrier between source 4 and the channel 3 prevents electrons to flow from the source 4 to the drain 6.

Finally, FIG. 2c shows the transistor 1 with an applied source-drain bias voltage and a positive gate voltage. As can be seen, the Schottky barrier between the source 4 and the channel 3 becomes thinner so that electrons $e^-$ can tunnel from the source 4 through the Schottky barrier and flow through the conduction band of the channel 3 into the drain 6. Accordingly, the state shown in FIG. 2c is designated as the ON state whereas the state shown in FIG. 2b is designated as OFF state. In this way the current flow from the source 4 to the drain 6 is controlled by the gate voltage.

FIG. 3 shows a Schottky tunnel transistor that has been described in IEEE Electron Device Letters, Vol. 15, No. 10, 1994, page 412. In this tunnel transistor electrons can tunnel through a very thin Schottky barrier formed between an accumulation layer 17 and the gate 8. Contrary to the transistor shown in FIG. 1, this tunnel transistor contains only a single Schottky barrier.

FIG. 4 shows a schematic structure of the transistor according to the invention in a cross sectional view. The transistor as a whole is designated with reference number 21. The transistor 21 comprises a nanowire 22, which is directly grown on a substrate 23 and which is realized as a longitudinal heterostructure. The present invention relates to nanowire structures with a diameter less than approximately 100 nm and preferably in the range of approximately 5 nm to approximately 50 nm with lengths in the range of approximately 50 nm to approximately 200 μm. Adjacent to the substrate 23 the nanowire 22 consists of highly n-type doped silicon forming the source 24 of the transistor 21. In the axial direction away from the substrate 23, the nanowire 22 continues with an intrinsic or lowly doped region 26 separating the source 24 from a barrier region 27. The barrier region 27 is made from metallic material. In the present embodiment it is cobalt silicide ($CoSi_2$). But in other embodiments also other metallic materials or highly doped semiconductors with a small band gap like indium arsenide (InAs), which is compatible with the silicon nanowire 22, could be used as well. Further in the axial direction away from substrate 23 the longitudinal nanowire 22 heterostructure continues again with a second intrinsic or lowly doped region 28 such that the barrier region 27 is sandwiched between the first and the second intrinsic or lowly doped regions 26, 28. The nanowire 22 is terminated with a highly n-type doped silicon region forming the drain 29 of the transistor 21. The perimeter of the nanowire 22 is covered with an electrically insulating dielectric layer 31. On the outer surface of the dielectric layer 31 a metallic gate layer 32 is deposited. The gate layer 32 is made e.g. from aluminum. However, aluminum is only one example and other metallic layers could be used as well. On top of the drain 29 there is an ohmic contact 33.

Like in the lateral transistor structure described in connection with FIG. 1 Schottky barriers are formed between the barrier region 27 and the intrinsic or lowly doped layers 26, 28. With no bias voltage applied between the source 24 and the drain 29 and no gate voltage applied, the Schottky barriers prevent electrons from flowing from the source 24 to the drain 29. The height of the Schottky barriers can be modulated by a gate voltage applied to the gate 32. When a source-drain bias voltage is applied and a gate voltage lowers the Schottky barriers than a current flows from the source 24 to the drain 29. On the right hand side of FIG. 4 the electronic structure of the transistor 21 is schematically visualized. At the interfaces between the barrier region 27 and the intrinsic or lowly doped regions 26, 28 the Schottky barriers are formed.

In another embodiment the dielectric layer 31 is replaced by a wide band gap semiconductor layer, e.g. $Al_{1-x}Ga_xAs$, which forms a Schottky barrier at the interface of the gate electrode. In alternative variants of this embodiment the wide band gap semiconductor layer may or may not contain a delta-doped layer (not shown in FIG. 4). The delta-doped layer increases the charge carrier density inside the nanowire 22 without introducing additional impurities inside the nanowire.

The current is composed of a thermionic emission current across the Schottky barriers and a tunneling current through the Schottky barriers. The total current depends exponentially on the effective height and width of the Schottky barrier that can be modulated by the gate voltage. In this way a transistor action can be achieved. As it can clearly be seen the effective gate length is defined by the thickness of the barrier region and can therefore be very thin. Accordingly the gate capacitance can be made very small and the transistor is appropriate to operate at high frequencies. In other words: Since the length of the gate is not defined by conventional masking techniques but rather by the thickness of the barrier region 27, which is grown epitaxially, the gate length of the transistor according to the present invention can be much shorter than compared with conventional transistor structures.

It is noted for the sake of completeness that the term "Schottky barrier" is commonly used for a metal-semiconductor interface. Therefore, if the barrier region 27 consists of a highly doped low band gap semiconductor (e.g. InAs) it is separated from the intrinsic or lowly doped region by a more general potential barrier.

The dimensions of the transistor structure 21 can be taken from FIG. 4 as well. The total length of the transistor structure in a direction normal to the surface of the silicon substrate 23 is 105 nm. The diameter of the nanowire 22 is approximately 30 nm and its parameter is covered with the electrically insulating dielectric layer 31 having a thickness of 1 nm. The total diameter of the nanowire covered by the dielectric layer is consequently 32 nm. The length of the gate electrode 32 in the longitudinal direction of the nanowire is 45 nm while the thickness of the barrier region 27 in the longitudinal direction is only 5 nm. However, it should be noted that these dimensions are only presented as examples and should not be understood to limit the scope of the present invention.

It is also noted that in another embodiment of the invention the intrinsic or lowly doped regions 26, 28 are made of gallium arsenide (GaAs) instead of silicon (Si).

In the following description and with reference to FIGS. 5a to 5h one possible sequence of processing steps is suggested to fabricate the transistor 21 shown in FIG. 4. It is noted that the described processing method is only one exemplary method and a person skilled in the art may conceive many variations from the disclosed processing method depending on the specific parameters of the device to be made.

The fabrication process begins with a standard n-type silicon substrate 23 which is made highly n-type doped by means of implantation. The doping level is in the order of $10^{+19}$ cm$^{-3}$ and is achieved by implantation of arsenic (As) or phosphorus (P) ions. A commercially available implanter is used for this step.

By a standard optical lithography a catalyst region is defined containing a precursor metal layer that acts as a growth catalyst 34. The catalyst 34 is used for the growth of a semiconducting nanowire. It is well known that a catalytic decomposition of a silicon containing gas by gold or iron can form long nanowires. This technique is usually called the vapor-liquid-solid (VLS) mechanism. A liquid nano droplet containing the metal and silicon is located at the tip of the growing wire. Unfortunately, gold and iron have a large diffusion coefficient in silicon and create deep electronic levels which are detrimental to the electronic performance of the finalized device. Therefore, metal silicides are much more preferred in semiconductor processing technologies when ever a metallic layer is necessary. For the present invention nickel and cobalt silicides have been used but in the following the process based on cobalt is described for the sake of simplicity but without limiting the scope of the invention.

According to a proposed method a cobalt layer is deposited by chemical vapor deposition (CVD) on commercially available silicon substrates. CoCl$_4$ gas is introduced in a reactor in a H$_2$ ambiance. The partial pressure of CoCl$_4$ is 0.06 Pascal and the total reactor pressure is 670 Pascal. On the surface of the silicon substrate the CoCl$_4$ reacts with the silicon of the substrate and forms CoSi$_2$. The deposition temperature of the substrate is chosen to be in the range of 600 to 700° C. In a subsequent annealing step at elevated temperatures in the order of 900° C. the formation of cobalt silicide is terminated. For growing silicon nanowires on the cobalt silicide, the substrate is exposed to an atmosphere in the reactor of SiH$_2$Cl$_2$ with a partial pressure of 70 Pascal in a 2.7 Kilopascal hydrogen atmosphere at temperatures around 650° C. Under these conditions silicon nanowires are growing on the cobalt silicide.

If it is desired to grow the nanowire as a silicon/germanium heterostructure a laser is utilized to evaporate germanium in the furnace from a solid target. The laser beam heats up the surface of the germanium target placed inside the furnace until germanium atoms are evaporated. The evaporated germanium atoms are then incorporated into the nanowire. Depending on the growth conditions it is possible to grow the nanowire as a axial Si/Ge heterostructure, i.e. the composition of the nanowire changes in its axial direction. One dimensional growth is maintained as long as the reacted decomposition takes place preferably at the interface between the cobalt silicide and the nanowire. Similarly, the Ge atoms evaporated from the Ge target are also incorporated into the growing nanowire at the interface between the cobalt silicide and the nanowire. By turning the silicon and germanium supplies alternatively on and off a nanowire is grown having a Si/Ge heterostructure in the axial direction of the nanowire.

The nanowire becomes n-type doped by adding arsine (AsH$_3$) or phosphine (PH$_3$) to the incoming gas stream. The doping level is determined by the partial pressure of the arsine or phosphine gas.

Figure 5A:
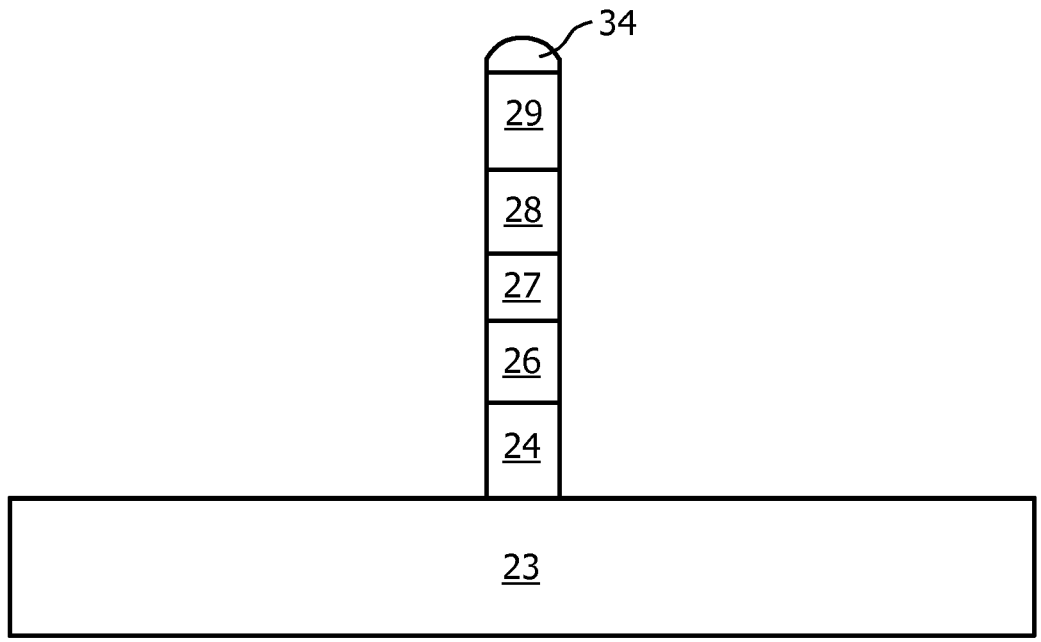

By appropriately selecting the growth parameters it is possible to grow the heterostructure shown in FIG. 5a. The barrier region 27 in this case is formed by highly n-doped Ge. In other embodiments the barrier region 27 consists of InAs or other small band gap semiconductors that can be grown as nanowires from the gaseous phase.

It is noted that the term "heterostructure" means in the present context a nanowire having a composition of different materials like silicon and germanium, the same material e.g. silicon having different doping types like n-type doped silicon and p-type doped silicon, and finally, the same material like silicon having different crystal orientations in the axial or radial direction of the nanowire. A radial heterostructure of a nanowire which is modulation doped e.g. of the surface of the nanowire can be very advantageous in the sense of a high majority carrier mobility.

Figure 5B:
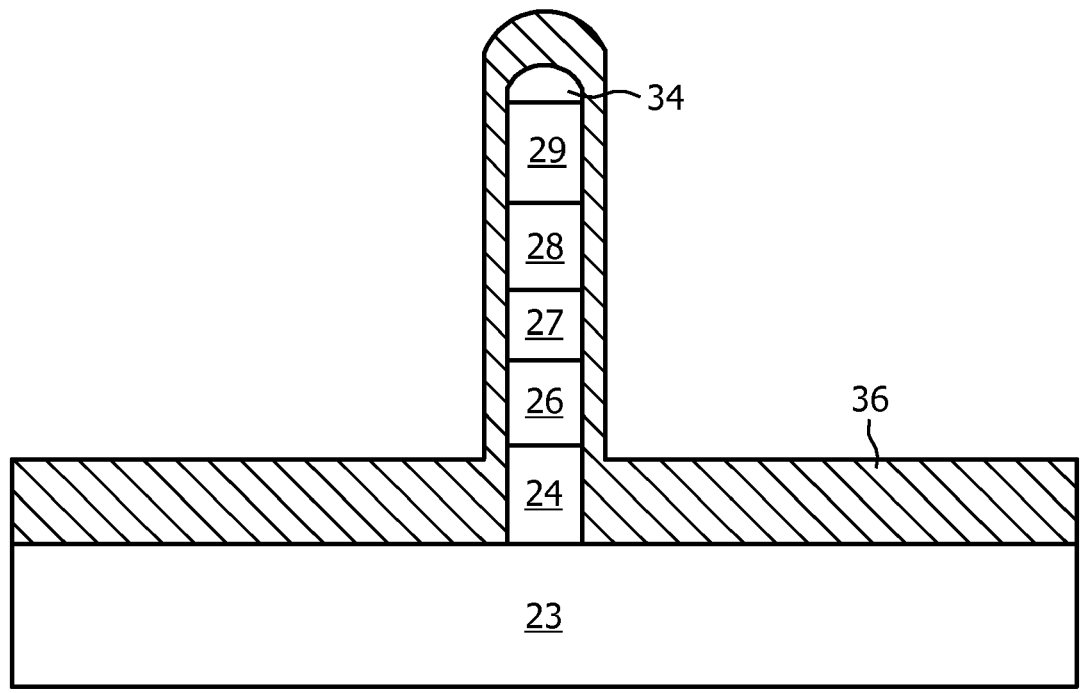
Figure 5C:
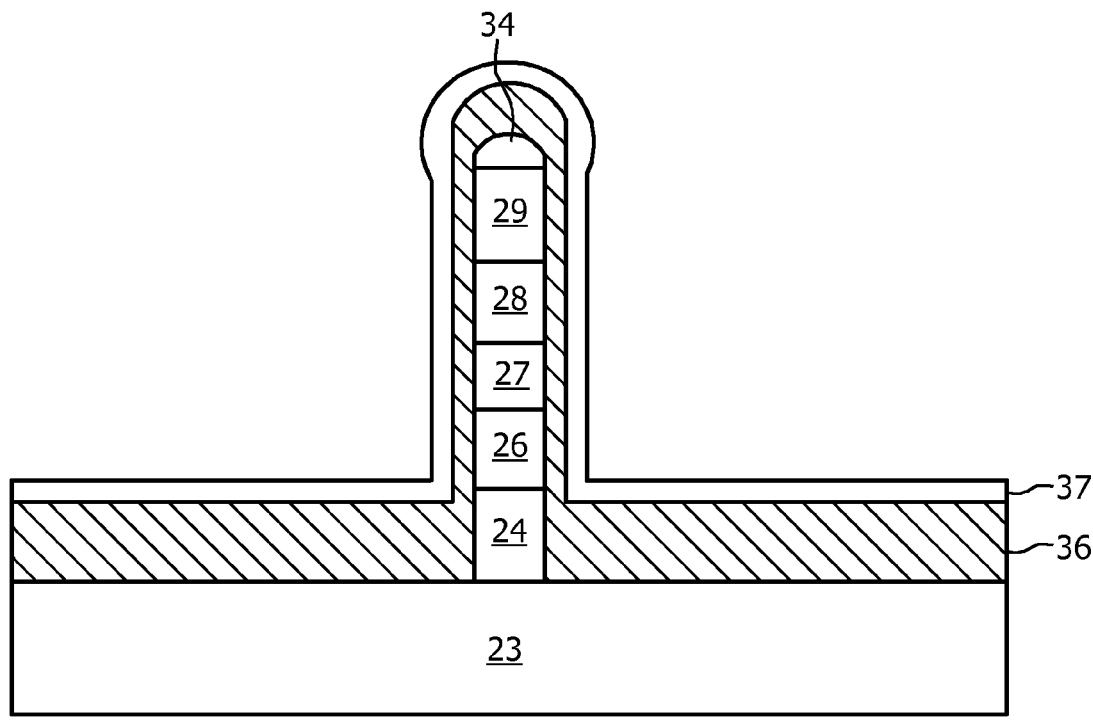
Figure 5D:
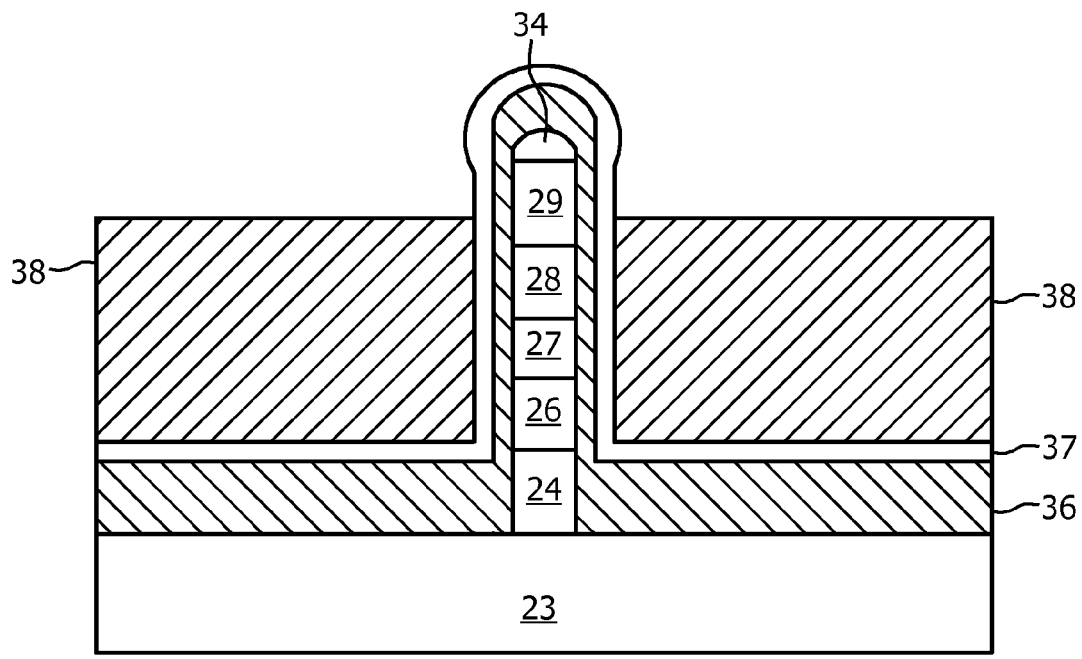
Figure 5E:
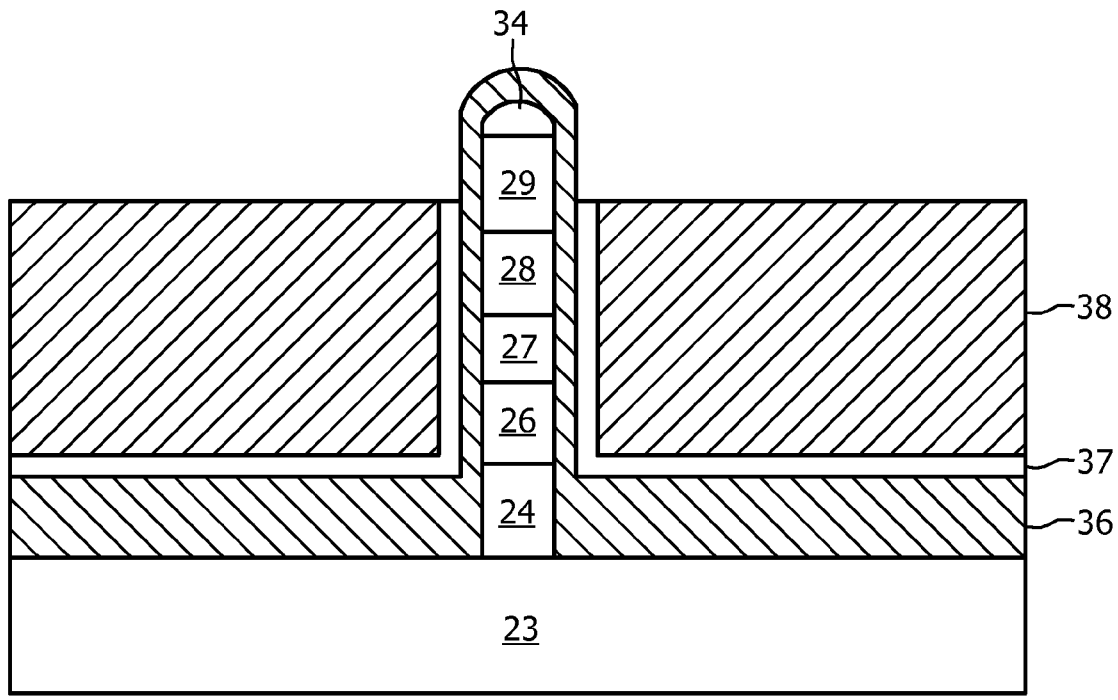
Figure 5F:
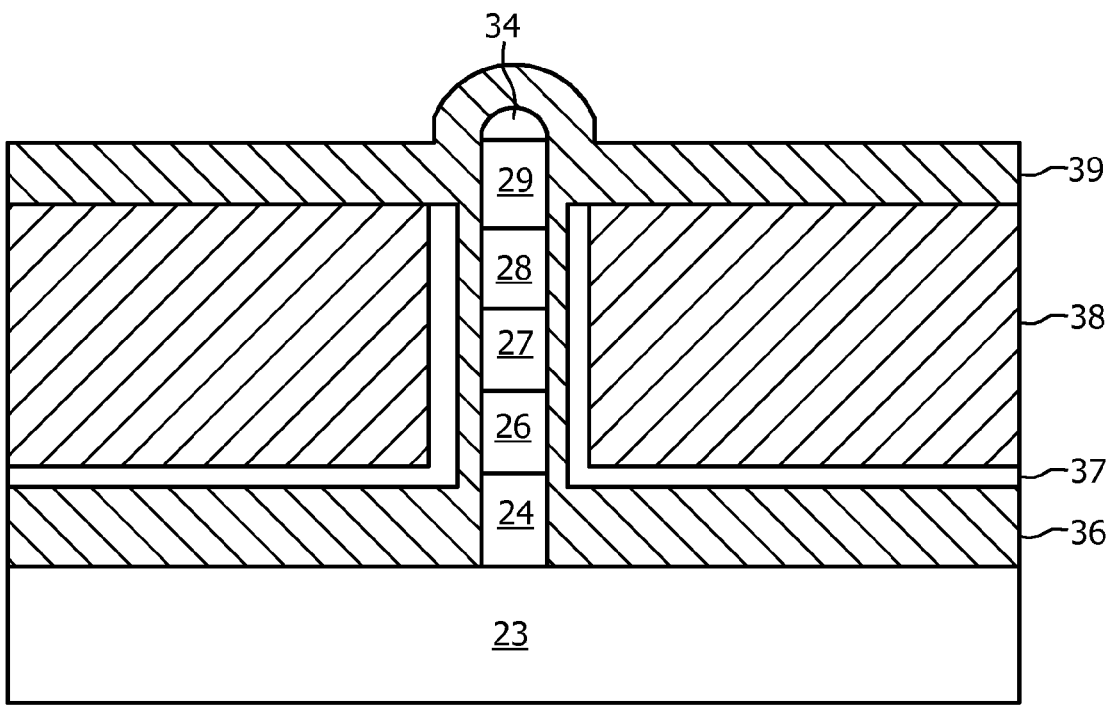
Figure 5G:
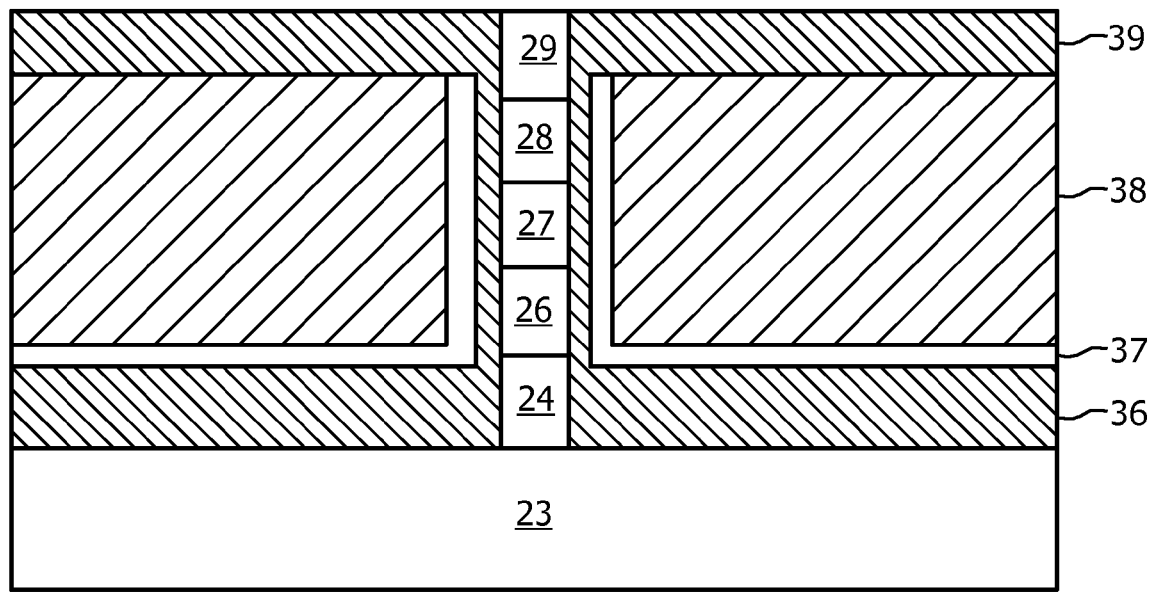
Figure 5H:
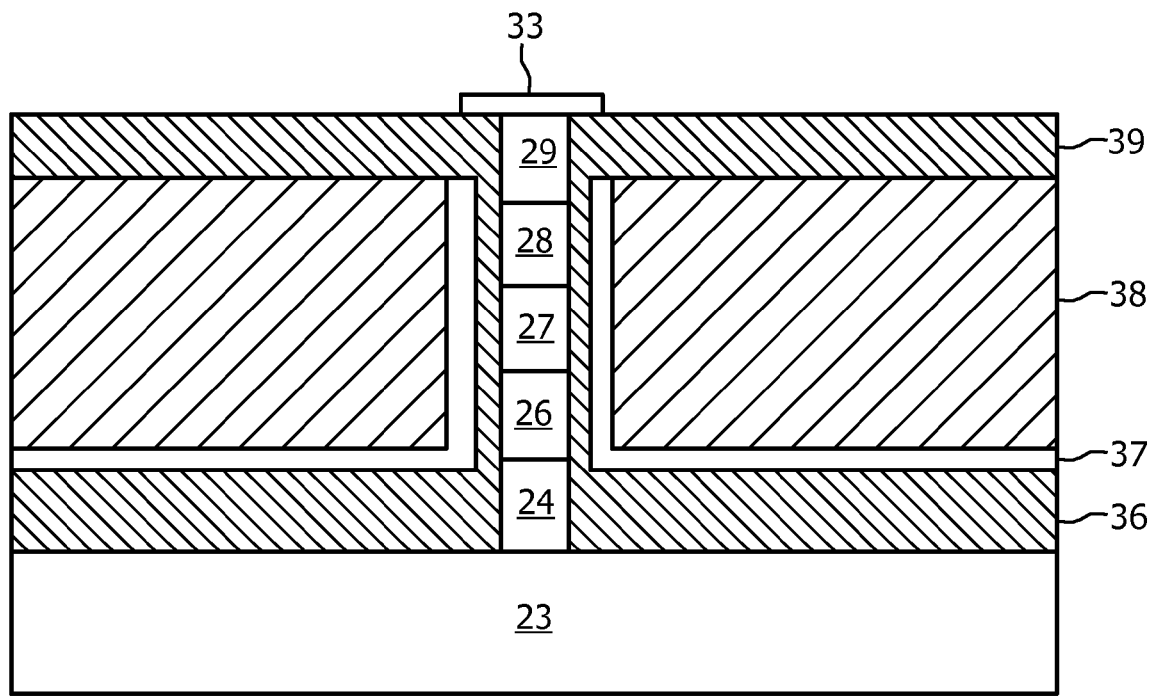

When the growth of the nanowire 22 is finished the structure is covered with a silicon oxide (SiO$_2$) layer 36 (FIG. 5b). Then a metal layer 37, e.g. aluminum, is deposited on top of the SiO$_2$ layer 36 (FIG. 5c). In the next step the metal layer 37 is covered by a thick highly n-doped polycrystalline silicon layer 38 with the exception of the top portion of the nanowire 22 (FIG. 5d). The metal layer 37 is etched away where it is not covered by the polycrystalline silicon layer by means of an appropriate wet etch (FIG. 5e). Then another SiO$_2$ layer 39 is deposited (FIG. 5f). After a planarisation step (FIG. 5g) the ohmic contact 33 is made to the drain 29. Contacts to the metal layer 38 forming the gate electrode are made in a conventional way by contacting the polycrystalline silicon layer. The source 24 is contacted by opening a window in the polycrystalline silicon and silicon oxide layers 38, 39 and by making a contact to the highly n-doped substrate 23.

In another embodiment the polycrystalline silicon layer is replaced by a metallic layer. Also, the silicon oxide forming the dielectric layer 36 can be replaced by other materials like wide band gap semiconductors forming a Schottky barrier at the interface to the gate electrode 38. During the growth of the wide band gap semiconductor a delta-doped layer can be incorporated.

In FIG. 6 an alternative embodiment of the inventive transistor 21' comprising a nanowire 22' is illustrated. It does not include a barrier region and only one Schottky barrier is formed between the drain 29 and the intrinsic or lowly doped region 26. The Schottky barrier between the drain and the intrinsic or lowly doped region 26 is modulated in a similar way as described for the transistor shown in FIG. 4. The transistor 21 shown in FIG. 4 is symmetrical with respect to source 24 and drain 29, i.e. exchanging the source and drain potentials only reverses the source-to-drain current but its magnitude remains the same. Contrary to that, the transistor 21' is non-symmetrical because it contains only one Schottky diode.

The nanowire 22' is grown in a corresponding way to the nanowire 22 by the VLS growth process utilizing a growth catalyst 34 (FIG. 7a). The main difference is that no barrier is grown in the nanowire 22'. Subsequently, the structure is covered with a dielectric layer 36. On the surface of the dielectric layer 36 a polycrystalline silicon layer 37 is deposited (FIG. 7a). After a planarisation step (FIG. 7b) contacts are made to the source 24, the drain 29 and the gate 32 (FIG. 6). Alternatively, the dielectric layer 36 can be replaced by a wide band gap semiconductor material, which may be provided with a delta-doped layer as it has already been described above.

The invention claimed is:

1. Transistor comprising a nanowire having a source and a drain separated by an intrinsic or lowly doped region, wherein a potential barrier is formed at the interface of the intrinsic or lowly doped region and one of the source and the drain, wherein a gate electrode is provided in the vicinity of the potential barrier such that the effective height and/or width of the potential barrier can be modulated by applying an appropriate voltage to the gate electrode.

2. Transistor according to claim 1, wherein a barrier region is located inside the intrinsic or lowly doped region between the source and the drain.

3. Transistor according to claim 1 wherein the barrier is a highly doped semiconductor material.

4. Transistor according to claim 3, wherein the semiconductor material forming the barrier region is indium arsenide while the adjacent intrinsic or lowly doped regions are made of silicon gallium arsenide.

5. Transistor according to claim 1, wherein the barrier is made from a metal.

6. Transistor according to claim 1, wherein the nanowire is grown on a semiconductor substrate.

7. Transistor according to claim 1, wherein the nanowire has highly doped end portions forming the source and the drain of the transistor.

8. Transistor according to claim 5, wherein the outer surface of the nanowire is covered by an insulating layer.

9. Transistor according to claim 8 wherein on the surface of the insulating layer a metal layer is deposited forming a gate electrode.

10. Transistor according to claim 8, wherein the insulating layer is a dielectric layer or a wide band gap semiconductor forming a Schottky barrier to the gate electrode.

11. Transistor according to claim 10, wherein the wide band gap semiconductor forming the Schottky barrier to the gate electrode contains a delta-doped layer.

* * * * *